(12) United States Patent
Dai et al.

(10) Patent No.: US 7,805,835 B2
(45) Date of Patent: Oct. 5, 2010

(54) METHOD FOR SELECTIVELY PROCESSING SURFACE TENSION OF SOLDER MASK LAYER IN CIRCUIT BOARD

(75) Inventors: Hsien-Ming Dai, Taoyuan (TW); Jen-Fang Chang, Taoyuan (TW); Jun-Chung Hsu, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 208 days.

(21) Appl. No.: 12/128,726

(22) Filed: May 29, 2008

(65) Prior Publication Data

US 2009/0293269 A1    Dec. 3, 2009

(51) Int. Cl.
*H05K 3/00* (2006.01)
*H01L 21/00* (2006.01)

(52) U.S. Cl. .............................. 29/843; 29/830; 29/832; 29/842; 438/106; 438/110; 438/127

(58) Field of Classification Search .................... 29/830, 29/832, 833, 840, 842, 843; 438/106, 110, 438/127
See application file for complete search history.

(56) References Cited

U.S. PATENT DOCUMENTS

| | | | | |
|---|---|---|---|---|
| 5,492,266 A | * | 2/1996 | Hoebener et al. | 228/248.1 |
| 5,766,674 A | * | 6/1998 | Hirosawa | 228/118 |
| 5,825,629 A | * | 10/1998 | Hoebener et al. | 361/777 |
| 6,794,225 B2 | * | 9/2004 | Manepalli et al. | 438/127 |
| 2003/0189243 A1 | * | 10/2003 | Jiang et al. | 257/684 |
| 2004/0121512 A1 | * | 6/2004 | Manepalli et al. | 438/106 |
| 2005/0195582 A1 | * | 9/2005 | Landeros et al. | 361/760 |
| 2007/0152024 A1 | * | 7/2007 | Pang et al. | 228/178 |

* cited by examiner

*Primary Examiner*—Carl J Arbes

(57) ABSTRACT

A method for selectively processing a surface tension of a solder mask layer in a circuit board is provided. The method conducts surface tension processing to the flip-chip area and the non-flip-chip area of the solder mask layer in the circuit board. Therefore, the underfill used in packaging configures relative contact angles at the flip-chip area and the non-flip-chip area of the solder mask layer, respectively. In such a way, the present invention is adapted to solve the difficulties of the underfill void bulb and the overflowing contamination at the same time.

2 Claims, 4 Drawing Sheets

METHOD FOR SELECTIVELY PROCESSING SURFACE TENSION OF SOLDER MASK LAYER IN CIRCUIT BOARD

BACKGROUND OF THE INVENTION

1. Field of the Invention

The present invention relates generally to a plating method without plating a conduction line, and more particularly, to a method for selectively processing a surface tension of a solder mask layer in a circuit board.

2. The Prior Arts

Nowadays, electronic products are fast developed with the trend toward lightness, slimness, and multifunction. Correspondingly, this demands greater I/O numbers for the chips of the electronic products. Currently, the flip-chip technology has been used in packaging many high class electronic products, and therefore the packaging densities thereof have also been increased correspondingly.

In order to increase a packing density, a distance between a chip and a pad thereof is desired to be reduced. In a packaging process, the chip is going to be stuck to a carrier board by a silver paste. However, the silver paste is likely to disperse from a flip chip area to an adjacent area, e.g., a pad, and contaminate the same. A contaminated pad may cause a false soldering or a poor soldering, thus affecting the yield and the reliability thereof.

Further, flip-chip chip size package (CSP) has become more widely used. For example, sometimes there might be a flip-chip and a wirebond simultaneously configured on a same carrier board. As such, if the silver paste for sticking the chip unfortunately disperses to and contaminates a wirebond finger, it may cause a wirebond failure.

Further, in a conventional flip-chip package on package (POP) design, because the tin ball pad is configured very close to the chip, the underfill may possibly disperse to the tin ball pad during a flip-chip underfill process. Furthermore, in a system in package (SIP) design, because of the problem of dispensing contamination on other areas, the carrier board cannot be made smaller, or loss of the electrical performance occurs.

In order to provide a solution to the aforementioned problem of silver paste disperses to adjacent area and contaminates the same, the current technology adopts: 1. Using other kinds of underfills to control the flowability of the fluid on the carrier board; 2. Providing a dam or configuring a groove on the solder mask to block underfill overflowing; 3. Increasing the distance from the dispensing position to the solder pad; or 4. Introducing a frame processing to block the underfill overflowing. However, these technologies have their own restrictions and demand a higher production cost, and have a narrow operation window.

SUMMARY OF THE INVENTION

A primary objective of the present invention is to provide a method for selectively processing a surface tension of a solder mask layer in a circuit board. The method selectively processes the surface tension to allow an underfill to disperse over a flip-chip area with a stable flow rate during a packaging process, thus eliminating the occurrence of air bubbles. Meanwhile, the underfill disperses over a part of a non-flip-chip area with a slow flow rate, so as to avoid from contaminating the wirebond finger or the tin POP ball grid array (BGA) pad.

For achieving the foregoing objective of the present invention, the present invention provides a method for selectively processing a surface tension of a solder mask layer in a circuit board. The method conducts surface tension processing to the flip-chip area and the non-flip-chip area of the solder mask layer in the circuit board. Therefore, the underfill used in packaging configures relative contact angles at the flip-chip area and the non-flip-chip area of the solder mask layer, respectively.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

During a packaging process, if the flowability and wettability of the adhesive or underfill used on a substrate, especially the solder mask can be controlled in different areas, the surface tensions can then be adaptively realized, in which a lower surface tension can be obtained at where a better dispersion is desired to increase the wettability, and otherwise a greater surface tension can be obtained at where a less dispersion is desired to decrease the flowability so as to avoid the overflowing contamination. In this concern, the present invention selectively realizes different surface tensions in different areas of a same carrier board, so as to generate different surface energies in the different areas. In such a way, the present invention is adapted to solve the difficulties of the underfill void bulb and the overflowing contamination at the same time.

With respect to the flowing principle of the underfill on the flip-chip substrate, the flowability of the underfill is mainly affected by the contact angle θ, in which a lager contact angle θ corresponds to a slower flowability of the adhesive or underfill. As such, if a larger contact angle θ is obtained by the adhesive or the underfill on the substrate surface, the adhesive or the underfill contaminates less at the adjacent area, e.g., the solder pad. Two different embodiments are to be discussed herebelow to illustrate the method for selectively processing the surface tension of the solder mask layer.

Figure 1A:
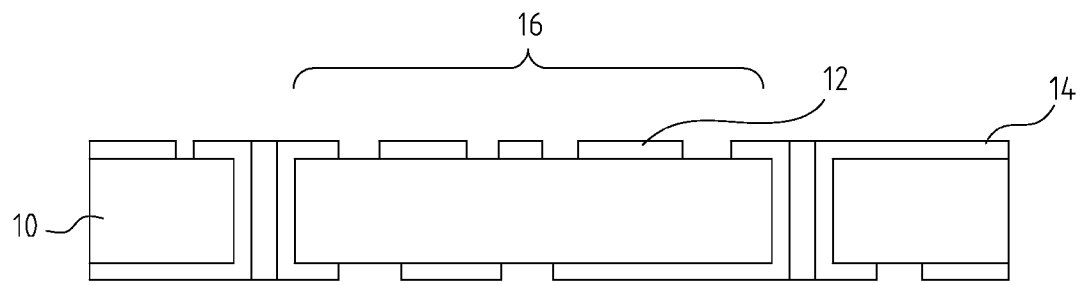
FIGS. 1A through 1G are schematic diagrams illustrating a method for selectively processing a surface tension of a solder mask layer in a circuit board according to a first embodiment of the present invention.
Figure 1B:
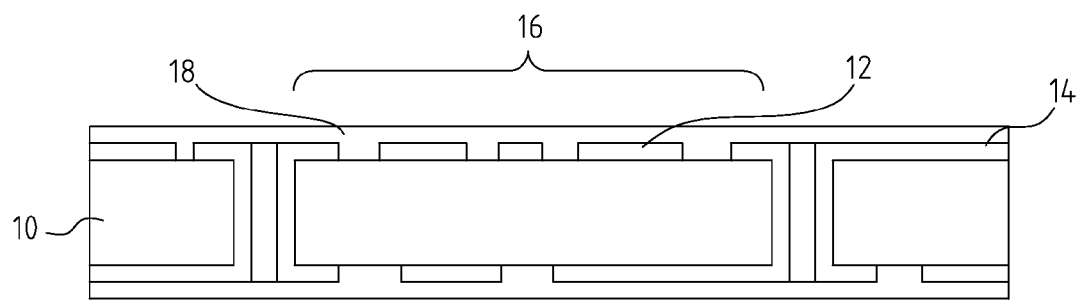
Figure 1C:
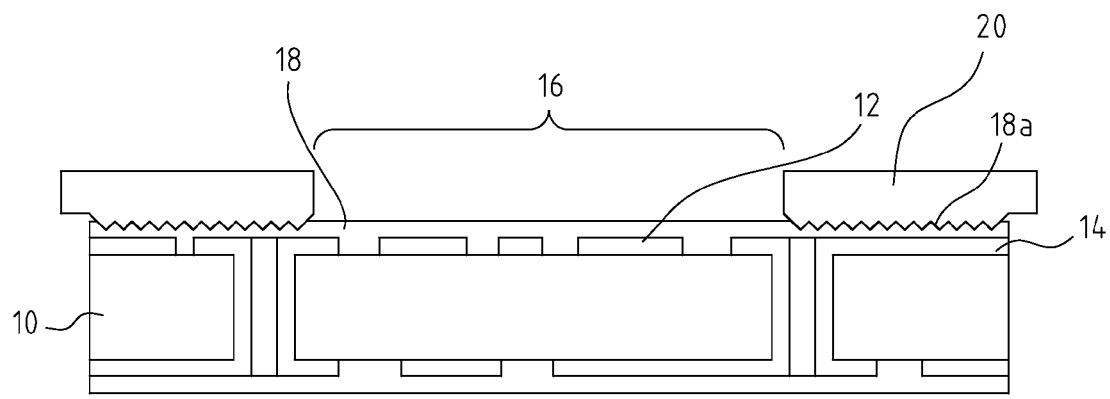
Figure 1D:
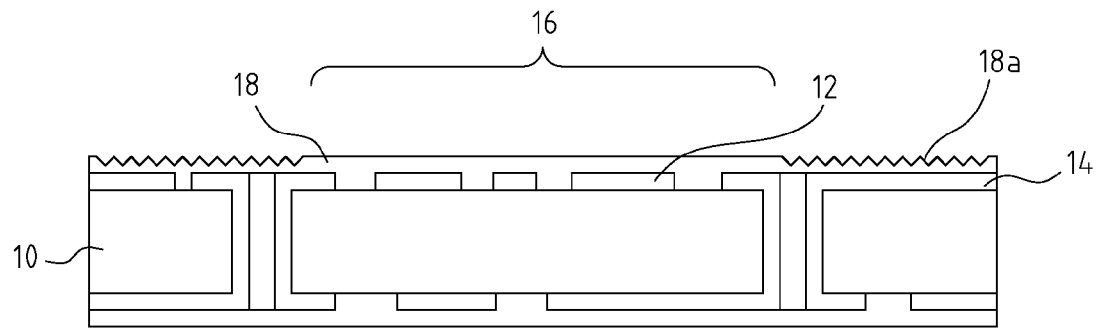
Figure 1E:
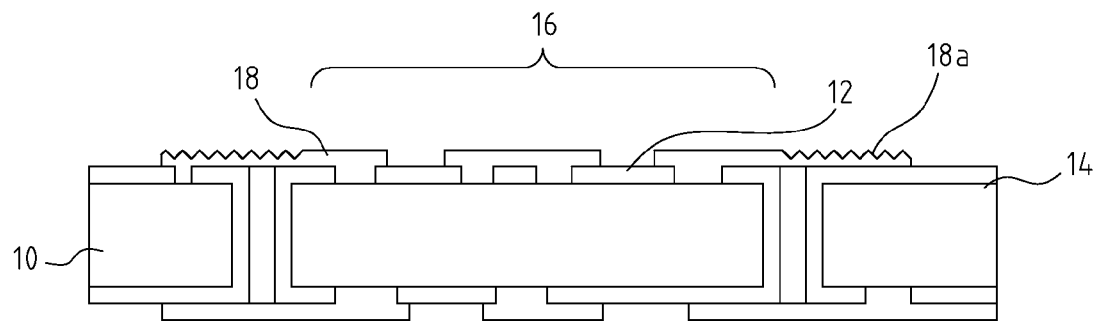
Figure 1F:
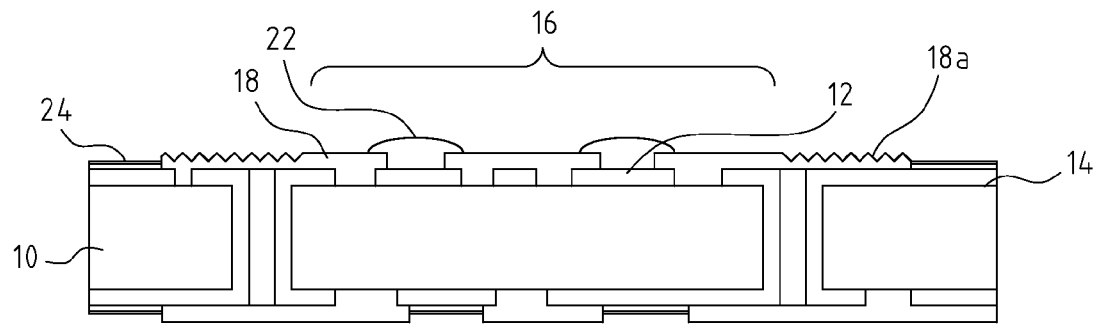
Figure 1G:
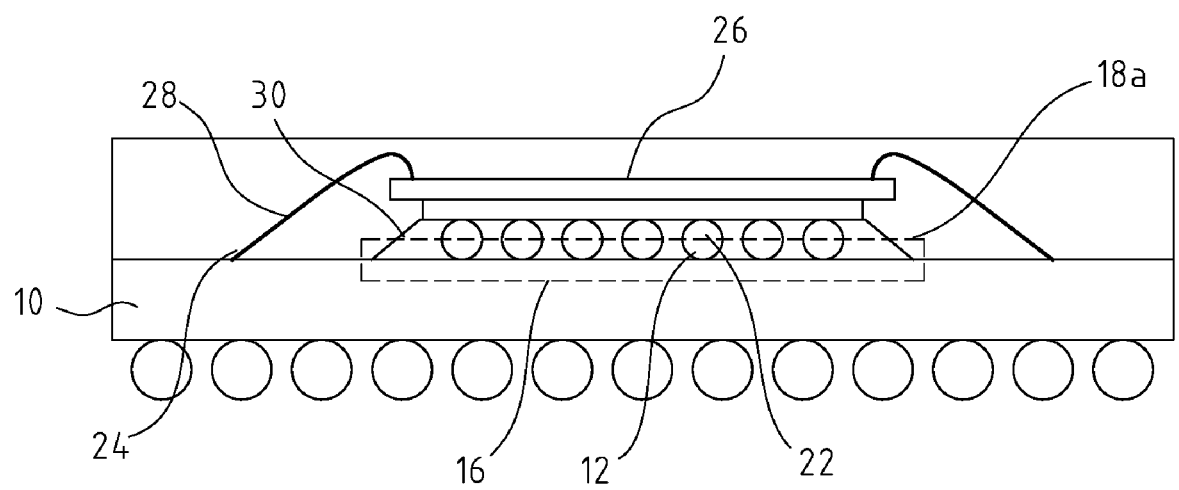

FIGS. 1A through 1G are schematic diagrams illustrating a method for selectively processing a surface tension of a solder mask layer in a circuit board according to a first embodiment of the present invention. As shown in FIG. 1A through 1B, in a circuit board 10, there is a solder mask layer 18 at least defining a flip-chip area 16 therein. There is a solder pad 12 covering or encircling the flip-chip area 16. The solder pad 12 is provided for electrically connecting a chip 26, as shown in FIG. 1G. Further, there is a connection pad 14 (or a gold finger 24 as shown in FIG. 1F) covering or encircling an area of the solder mask layer 18 which is not the flip-chip area 16. The connection pad 14 is provided for electrically connecting with another carrier board (not shown) or another wirebond finger (not shown).

According to the embodiment of the present invention, the surface tension processing can be either physical processing or chemical processing. As shown in FIG. 1C, the flip-chip area 16 of the solder mask layer 18 and the solder mask layer 18 that is not the flip-chip 16 are applied with different surface tension processing. According to the current embodiment of the present invention, a mechanical roughening physical processing is a main approach to realize distinctive surface tensions thereby. For example, as shown in FIG. 1C, a pressing plate 20 having saw teeth pattern configured on a surface thereof is provided to transfer printing the saw teeth pattern onto the solder mask layer 18, so as to configure a rough surface 18a at a part of the solder mask layer 18. Then, as shown in FIG. 1E, a part of the rough surface 18a has to be removed away to expose the connection pad 14 for later wirebond or packaging processing. Then, as shown in FIG. 1F, the connection pad 14 is plated with gold to protect the connection pad 14, and to configure a gold finger 24. In the meantime, a tin ball 22 is filled on the solder pad 12.

As shown in FIG. 1G, during the final packaging, the chip 26 is resided thereby, and the wirebond 28 is configured. In addition, because of the aforementioned surface tension processing, the underfill 30 used for packaging configures relative contact angles at the flip-chip area 16 of the solder mask layer 18 and the solder mask layer 18 which is not the flip-chip area 16, respectively. Specifically, the contact angle of the underfill 30 configured at the flip-chip area 16 of the solder mask layer 18 is smaller than the contact angle of the underfill 30 configured at the solder mask layer 18 which is not the flip-chip area 16, i.e., the rough surface 18a. As such, because a greater contact angle indicates a slower flow rate of the underfill 30, the underfill 30 will not disperse to the connection pad 14 or the gold finger 24 when entering the rough surface 18a, and thus avoiding contamination to the connection pad 14 or the gold finger 24. On the contrary, when applying a surface tension processing to reduce the surface tension of the flip-chip area 16 of the solder mask layer 18, the underfill 30 will obtain a better dispersibility, and thus avoiding the occurrence of an underfill void.

Figure 2A:
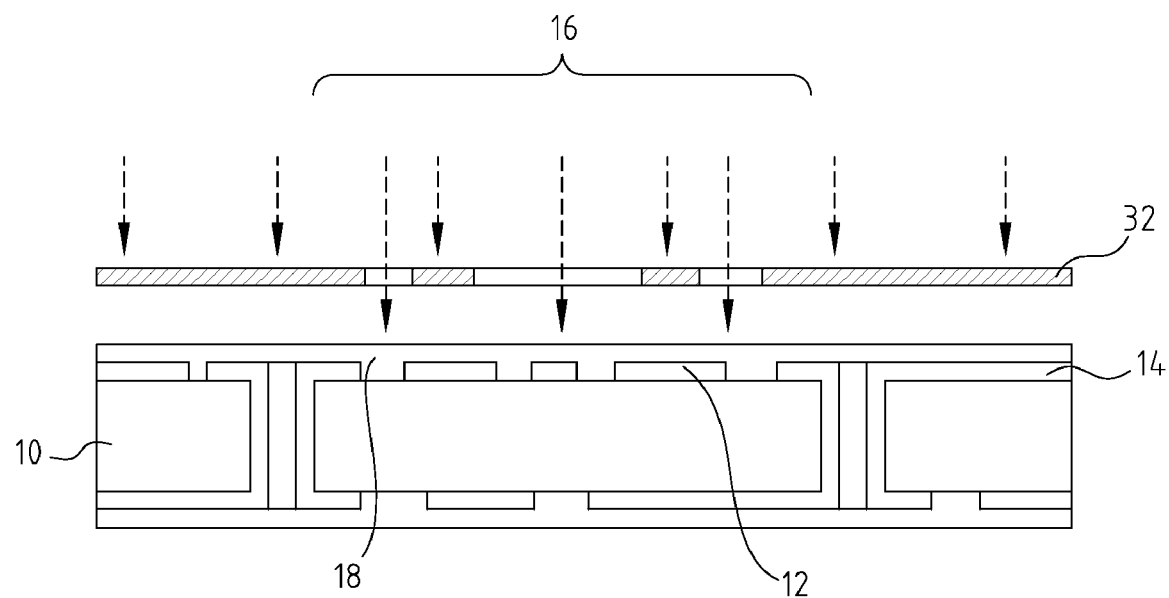
FIGS. 2A through 2B are schematic diagrams illustrating a method for selectively processing a surface tension of a solder mask layer in a circuit board according to a second embodiment of the present invention.
Figure 2B:
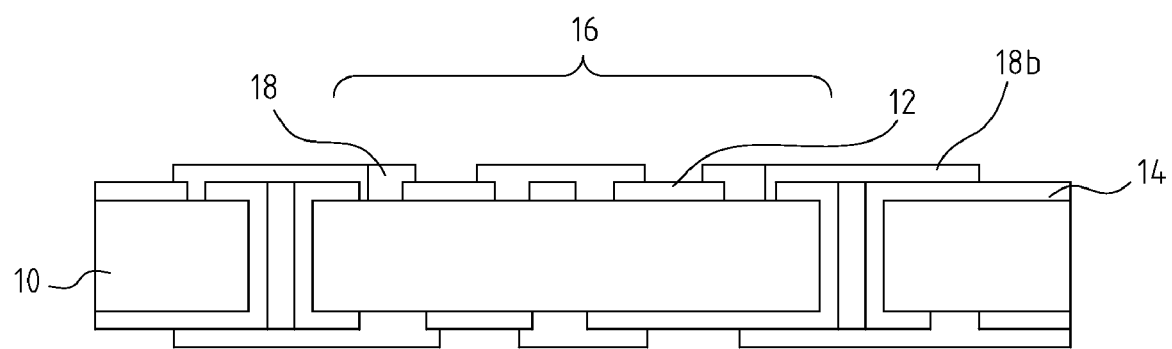

FIGS. 2A through 2B are schematic diagrams illustrating a method for selectively processing a surface tension of a solder mask layer in a circuit board according to a second embodiment of the present invention. Referring to FIGS. 2A and 2B, in the circuit board 10, the solder mask layer 18 at least defines a flip-chip area 16 therein. The solder pad 12 covers or encircles the flip-chip area 16. The solder pad 12 is provided for electrically connecting a chip. Further, the connection pad 14 covers or encircles an area of the solder mask layer 18 which is not the flip-chip area 16. The connection pad 14 is provided for electrically connecting with another carrier board (not shown) or another wirebond finger (not shown).

When a chemical processing such as a selective exposing/developing process is provided for surface tension processing, a photo mask 32 is employed to conduct the selective exposing/developing process to the solder mask 18, so as to configure a specific surface 18b having a higher surface tension. Similarly, because a greater contact angle indicates a slower flow rate of the underfill 30, the underfill 30 will not disperse to the connection pad 14 or the gold finger 24 when entering the rough surface 18b, and thus avoiding contamination to the connection pad 14. On the contrary, when applying a surface tension processing to reduce the surface tension of the flip-chip area 16 of the solder mask layer 18, the underfill 30 will obtain a better dispersibility, and thus avoiding the occurrence of an underfill void.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for selectively processing surface tension of a solder mask layer on a circuit board before bonding a chip, comprising the steps of:
   forming a plurality of solder pads in a flip-chip area on said circuit board;
   preparing a solder mask layer on said circuit board to cover said flip-chip area and a non-flip-chip area outside said flip-chip area, said solder mask layer covering said plurality of solder pads in said flip-chip area;
   using a pressing plate having a saw tooth pattern to press said solder mask layer on said non-flip-chip area to transfer said saw tooth pattern onto said solder mask layer and form a rough surface on said solder mask layer in a part of said non-flip-chip area;
   removing a portion of said solder mask layer to expose said plurality of solder pads; and
   forming a plurality of tin balls on the exposed solder pads.

2. A method for selectively processing surface tension of a solder mask layer on a circuit board before bonding a chip, comprising the steps of:
   forming a plurality of solder pads in a flip-chip area on said circuit board;
   preparing a solder mask layer on said circuit board to cover said flip-chip area and a non-flip-chip area outside said flip-chip area, said solder mask layer covering said plurality of solder pads in said flip-chip area;
   using a photo-mask for chemical processing said solder mask layer to selectively roughening said solder mask layer so that said solder mask layer in said flip-chip area has a surface contact angle smaller than the surface contact angle in said non-flip-chip area;
   removing a portion of said solder mask layer to expose said plurality of solder pads; and
   forming a plurality of tin balls on the exposed solder pads.

* * * * *